(12) United States Patent
Kim et al.

(10) Patent No.: US 11,205,441 B2
(45) Date of Patent: *Dec. 21, 2021

(54) PROCESSING AUDIO IN MULTIPLE FREQUENCY BANDS WITH RESONATORS

(71) Applicant: SAMSUNG ELECTRONICS CO., LTD., Suwon-si (KR)

(72) Inventors: Cheheung Kim, Yongin-si (KR); Sungchan Kang, Hwaseong-si (KR); Sangha Park, Seoul (KR); Yongseop Yoon, Seoul (KR); Choongho Rhee, Anyang-si (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/952,339

(22) Filed: Nov. 19, 2020

(65) Prior Publication Data
US 2021/0074313 A1 Mar. 11, 2021

Related U.S. Application Data

(63) Continuation of application No. 15/994,171, filed on May 31, 2018, now Pat. No. 10,878,834.

(30) Foreign Application Priority Data

Oct. 23, 2017 (KR) .......................... 10-2017-0137375

(51) Int. Cl.
| | | |
|---|---|---|
| *G10L 25/84* | (2013.01) | |
| *H04R 1/24* | (2006.01) | |
| *H04R 1/40* | (2006.01) | |
| *G10L 17/22* | (2013.01) | |
| *G10L 25/21* | (2013.01) | |
| *H04R 17/02* | (2006.01) | |
| *H04R 17/10* | (2006.01) | |
| *H04R 1/28* | (2006.01) | |
| *G10L 21/0388* | (2013.01) | |

(Continued)

(52) U.S. Cl.
CPC ...... *G10L 21/0388* (2013.01); *G10L 21/0232* (2013.01); *H03G 5/165* (2013.01); *G10L 25/18* (2013.01)

(58) Field of Classification Search
CPC . G10L 21/0388; G10L 21/0232; G10L 25/18; H03G 5/165
USPC ...................................................... 381/94.3
See application file for complete search history.

(56) References Cited

U.S. PATENT DOCUMENTS 3,989,897 A * 11/1976 Carver ................... H03G 5/165
381/94.3
6,012,334 A    1/2000 Ando et al.
(Continued)

*Primary Examiner* — Paul Kim
*Assistant Examiner* — Douglas J Suthers
(74) *Attorney, Agent, or Firm* — Sughrue Mion, PLLC

(57) ABSTRACT

Sound signal processing apparatuses and methods of operating the same are provided. The sound signal processing apparatus includes: a band separator configured to separate sound signals into frequency bands; an adder configured to add sound signals; and a signal processor that is arranged between the band separator and the adder and comprises a plurality of signal processing blocks. The band separator includes elements for separating the sound signals into frequency bands, and the elements correspond one to one to the signal processing blocks.

21 Claims, 7 Drawing Sheets

(51) Int. Cl.
  *H03G 5/16*       (2006.01)
  *G10L 21/0232*    (2013.01)
  *G10L 25/18*      (2013.01)

(56) References Cited

U.S. PATENT DOCUMENTS

| | | |
|---|---|---|
| 6,223,601 B1 | 5/2001 | Harada et al. |
| 6,591,234 B1 * | 7/2003 | Chandran ............ G10L 21/0208 704/225 |
| 6,678,648 B1 * | 1/2004 | Surucu .................. G10L 19/035 704/200.1 |
| 8,326,246 B2 | 12/2012 | Monat et al. |
| 9,479,884 B2 | 10/2016 | Kim |
| 2016/0050506 A1 * | 2/2016 | Kim ..................... H04R 17/025 381/56 |
| 2018/0038901 A1 | 2/2018 | Kim et al. |

* cited by examiner

FIG. 10
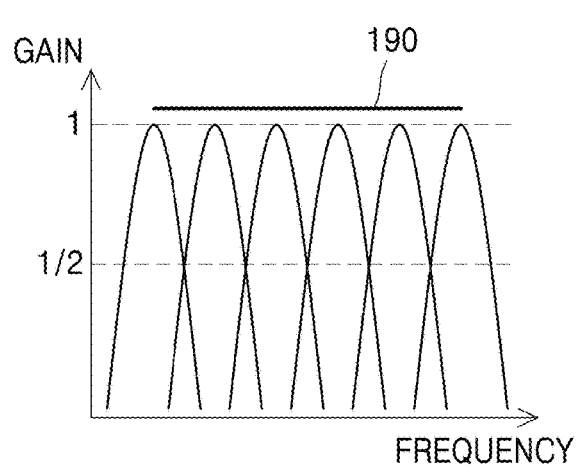
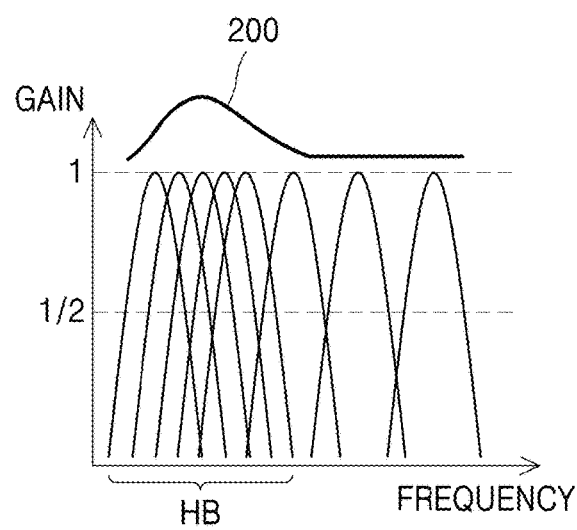

PROCESSING AUDIO IN MULTIPLE FREQUENCY BANDS WITH RESONATORS

CROSS-REFERENCE TO RELATED APPLICATION

This application is a continuation of U.S. patent application Ser. No. 15/994,171, filed May 31, 2018, in the United States Patent Office, which claims priority from Korean Patent Application No. 10-2017-0137375, filed on Oct. 23, 2017, in the Korean Intellectual Property Office, the disclosures of which are incorporated herein by reference in their entireties.

BACKGROUND

1. Field

Exemplary embodiments relate to acoustic devices, and more particularly, to sound signal processing apparatuses and methods of operating the same.

2. Description of the Related Art

A microphone obtains uniform inputs with respect to all audible bands by using a wide band vibrator. In order to remove noise from a signal or to emphasize/attenuate a band, the following algorithms and signal processing and a plurality of microphones are used.

Spectral subtraction in a single channel: This is a method of retrieving a signal by subtracting a spectrum of noise in a state in which the signal and noise are mixed after estimating noise through acquiring a noise section in advance for a certain period of the section and securing a spectrum characteristic of the noise.

Beam forming through a plurality of channels: This is a method of selectively removing noise by analyzing recorded results in which noise and a signal are recorded with different relative intensities from each other through a plurality of microphones in the case when a noise direction and a signal direction are spatially distinguishable.

Source separation through a plurality of channels: This is a method of individually separating the plurality of original sound sources by obtaining an inversion matrix after extracting a matrix relationship between signals that are mixed through mediums or spatial channels assuming that a plurality of sound sources inputted to a plurality of channels are independent from each other.

SUMMARY

Exemplary embodiments include sound signal processing apparatuses configured to increase noise removing efficiency.

Exemplary embodiments include methods of operating the sound signal processing apparatuses.

Additional aspects will be set forth in part in the description which follows and, in part, will be apparent from the description, or may be learned by practice of the exemplary embodiments.

According to an aspect of an exemplary embodiment, a sound signal processing apparatus includes: a band separator configured to separate sound signals based on frequency bands; an adder configured to add the separated sound signals; and a signal processor that is arranged between the band separator and the adder and includes a plurality of signal processing blocks.

The band separator may include elements configured to separate the sound signals based on the frequency bands, wherein the elements correspond one to one to the signal processing blocks.

The band separator may include a plurality of resonators configured to separate the sound signals based on the frequency bands.

The signal processing blocks respectively may include selectors configured to select a sound signal to be processed.

An arrangement density of the resonators may be uniform with respect to a combination of the frequency bands or may vary based on the frequency bands.

The resonators may be arranged in a row and may have lengths that are different from each other.

The resonators may be arranged in a circular shape and may have lengths that are different from each other.

Each of the signal processing blocks may further include an amplifier configured to amplify a signal received from the selector; and a sign determiner configured to determine a sign of a signal received from the amplifier.

According to an aspect of another exemplary embodiment, a method of operating a sound signal processing apparatus is provided. The method includes: after separating an inputted sound signal into a plurality of sound signals, the sound signals respectively are processed by using a plurality of signal processing blocks. Afterwards, sound signals outputted by the signal processing blocks are added.

The inputted sound signals may be separated into the plurality of sound signals by using a plurality of resonators.

The processing of the sound signals by using the signal processing blocks may include controlling an overall gain profile of the sound signal processing apparatus.

The processing of the sound signals by using the signal processing blocks may include determining whether or not the sound signals are sound signals to be processed.

The processing of the sound signals by using the signal processing blocks may include amplifying the sound signals to be processed when the sound signals to be processed are determined.

The processing of the sound signals by using the signal processing blocks may include determining a respective sign of each of the amplified sound signals and outputting the amplified sound signals.

The amplifying of the sound signals to be processed may include differentiating an amplifying rate of a first portion of an entirety of sound signals determined as sound signals to be processed from an amplifying rate of a remaining portion of the entirety of the sound signals.

The controlling of the overall gain profile of the sound signal processing apparatus may include changing the overall gain profile from a flat gain profile to a non-flat gain profile, or vice versa.

The determining whether or not the sound signals are sound signals to be processed may include comparing an intensity of each of the sound signals to a threshold intensity level.

BRIEF DESCRIPTION OF THE DRAWINGS

These and/or other aspects will become apparent and more readily appreciated from the following description of exemplary embodiments, taken in conjunction with the accompanying drawings in which:

FIGS. 8, 9, and 10 are gain-frequency graphs showing a method of controlling an overall gain profile in a sound signal processing apparatus, according to an exemplary embodiment.

DETAILED DESCRIPTION

Figure 1:
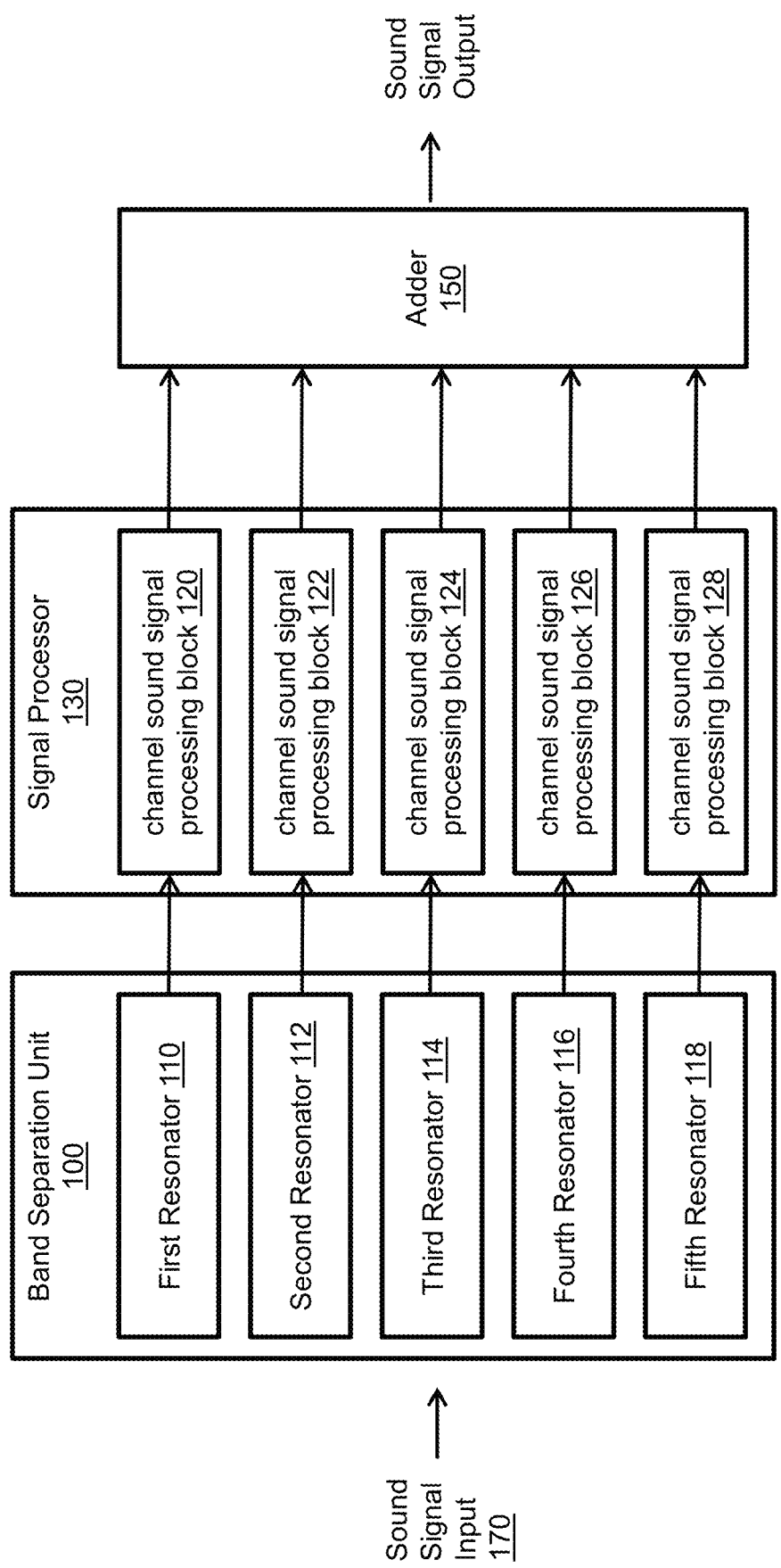
FIG. 1 is a block diagram of a sound signal processing apparatus, according to an exemplary embodiment.

Exemplary embodiments will be described more fully hereinafter with reference to the accompanying drawings, in which various embodiments are shown. The present inventive concept may, however, be embodied in many different forms, and should not be construed as limited to the exemplary embodiments set forth herein. Rather, these embodiments are provided so that the present disclosure will be thorough and complete. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting to "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation(s) depicted in the drawings. For example, if the device illustrated in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by a person having ordinary skill in the art to which the present disclosure pertains. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, exemplary embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, sound signal processing apparatuses according to an exemplary embodiment and methods of operating the same will be described in detail with reference to the accompanying drawings. The operating method will be described together with the description of the sound signal processing apparatus. In the drawings, thicknesses of layers or regions may be exaggerated for clarity of specification.

FIG. 1 is a block diagram of a sound signal processing apparatus, according to an exemplary embodiment.

Referring to FIG. 1, the sound signal processing apparatus includes a frequency band separator (hereinafter referred to as a "band separator" and/or as a "band separation unit") 100, a signal processor (also referred to herein as a "signal processing unit") 130, and an adder 150. The band separation unit 100 separates an inputted sound signal 170 into sound signals based on frequency bands. The sound signal 170 may include various sounds to be heard from surroundings including human voices. For example, the various sounds may include sounds of artificial things that create sounds while operating, such as vehicles or airplanes, music, colliding sounds, mechanical sounds, or naturally generated sounds (for example, the sound of wind, the sound of rain, or the sound of birds).

The band separation unit 100 may include first, second, third, fourth, and fifth minute resonators 110, 112, 114, 116, and 118 that form an array. The first resonator 110 includes a first resonance frequency f1. The second resonator 112 includes a second resonance frequency f2. The third resonator 114 includes a third resonance frequency f3. The fourth resonator 116 includes a fourth resonance frequency f4. The fifth resonator 118 includes a fifth resonance frequency f5. The first through fifth resonance frequencies f1 through f5 are different from each other. The first through fifth resonance frequencies f1 through f5 may be respective center frequencies of sound bands that are different from each other. As described above, the first through fifth resonators 110, 112, 114, 116, and 118 have resonance frequencies that are different from each other, and thus, each of the first through fifth resonators 110, 112, 114, 116, and 118 may be used as a filter, each transmitting a frequency of a specific band. Accordingly, each of the first through fifth resonators 110, 112, 114, 116, and 118 may perform a channel function. A resonance frequency difference between the first through fifth resonators 110, 112, 114, 116, and 118 may be maintained as a constant frequency difference. As an example, a resonance frequency difference between the first through fifth resonators 110, 112, 114, 116, and 118 may be 10 Hz.

According to another exemplary embodiment, a resonance frequency difference between some pairs of the first through fifth resonators 110, 112, 114, 116, and 118 may be different from a resonance frequency difference between other pairs of resonators. For example, characteristics (shape, mass, length, etc.) of the first through fifth resonators 110, 112, 114, 116, and 118 may be controlled so that a resonance frequency difference between the first through third resonators 110, 112, and 114 is 10 Hz, and a resonance frequency difference between the third through fifth resonators 114, 116, and 118 is 20 Hz.

In FIG. 1, the band separation unit 100 is depicted as including first through fifth resonators 110, 112, 114, 116, and 118 for convenience of explanation. However, the number of resonators not limited thereto. For example, the band separation unit 100 may include a resonator arrangement or a resonator array, including more than 5 resonators. A desired number of resonators may be included in the band separation unit 100 based on a sound signal to be processed, that is, a frequency band of the sound signal 170 inputted to the band separation unit 100.

In this way, the band separation unit 100 that separates a particular band into a plurality of bands using a plurality of minute resonators may have the same structure as a sub-band filter bank that separates an overall band into divided bands.

The signal processor 130 is arranged between the band separation unit 100 and the adder 150. The signal processor 130 includes a plurality of individual channel sound signal processing blocks 120, 122, 124, 126, and 128. The number of individual channel sound signal processing blocks 120, 122, 124, 126, and 128 included in the signal processor 130 may be equal to the number of the first through fifth resonators 110, 112, 114, 116, and 118 included in the band separation unit 100. Accordingly, the individual channel sound signal processing blocks 120, 122, 124, 126, and 128 may correspond on a one-to-one basis with respect to the first through fifth resonators 110, 112, 114, 116, and 118 included in the band separation unit 100. The individual channel sound signal processing blocks 120, 122, 124, 126, and 128 respectively may determine whether or not a sound signal provided from the corresponding resonator of the band separation unit 100 is a sound signal to be processed.

If the provided sound signal is determined as a sound signal to be processed, each of the individual channel sound signal processing blocks 120, 122, 124, 126, and 128 respectively processes the provided sound signal according to a control signal and outputs the processed sound signal. The control signal may include a signal for controlling gain with respect to the sound signal. The control signal may be generated according to a control condition set in advance. Further, the control signal may be provided in advance or in real-time by a user.

Whether or not a sound signal provided from the band separation unit 100 is to be processed may be determined by the following method.

In detail, a threshold intensity level regarded as a noise signal is set in each of the individual channel sound signal processing blocks 120, 122, 124, 126, and 128. The threshold intensity may be a signal intensity that corresponds to a resonance critical value or less of each of the first through fifth resonators 110, 112, 114, 116, and 118 that respectively correspond to the individual channel sound signal processing blocks 120, 122, 124, 126, and 128.

A noise signal may also be included in the sound signal provided from each of the first through fifth resonators 110, 112, 114, 116, and 118 of the band separation unit 100. When the intensity of a sound signal inputted to each of the individual channel sound signal processing blocks 120, 122, 124, 126, and 128 is compared to a threshold intensity level set in advance, if the intensity of the inputted sound signal is less than the set threshold intensity level, the inputted sound signal is regarded as a noise signal and is excluded from a sound signal to be processed.

However, if the intensity of the inputted sound signal is greater than the threshold intensity level, the inputted sound signal is regarded as a sound signal to be processed, and thus, subsequent processes are performed.

Sound signals outputted from the individual channel sound signal processing blocks 120, 122, 124, 126, and 128 are transmitted to the adder 150 and added together in the adder 150. Afterwards, a final sound signal is outputted.

Figure 2:
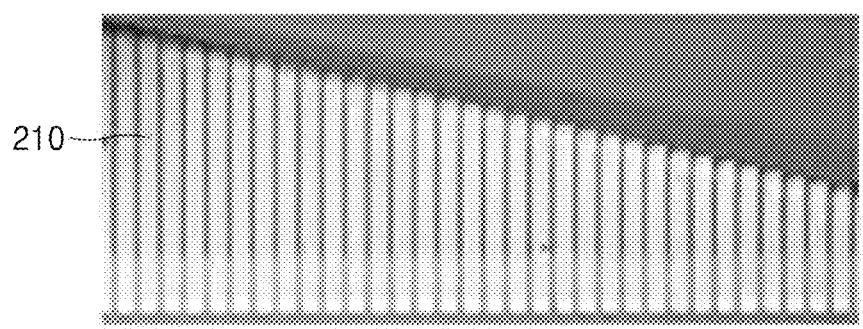
FIGS. 2, 3, and 4 are photos showing various configurations of a resonance unit of FIG. 1.
Figure 3:
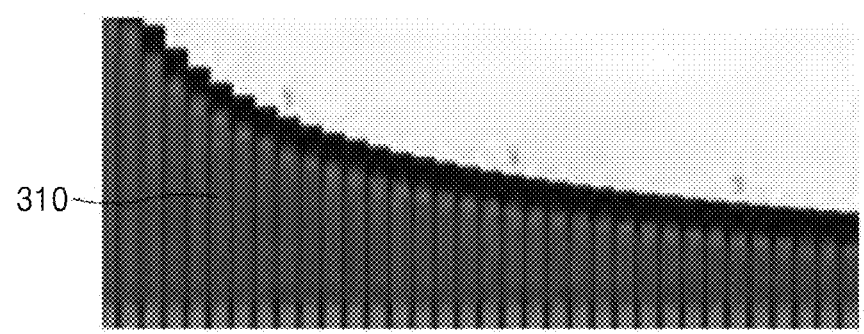
Figure 4:
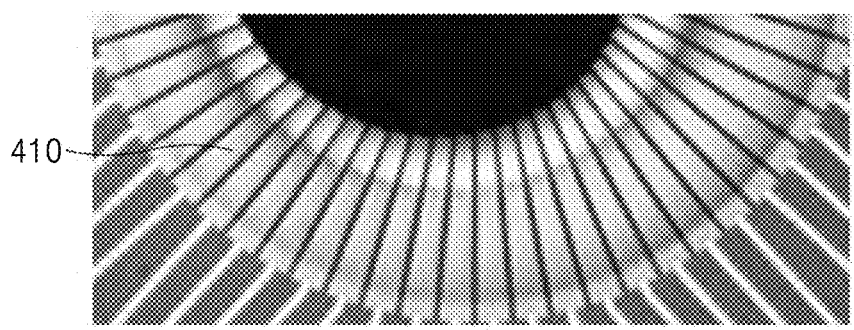

As depicted in FIGS. 2, 3, and 4, the band separation unit 100 may include a resonator array that includes a plurality of resonators 210, 310, and 410.

In FIGS. 2, 3, and 4, reference numerals 210, 310, and 410 indicate one minute resonator of a plurality of minute resonators. FIG. 2 shows a case in which respective lengths of the resonators 210 arranged in a row are linearly decreasing from the left side to the right side, FIG. 3 shows a case in which respective lengths of the resonators 310 arranged in a row are nonlinearly decreasing from the left side to the right side, and FIG. 4 shows a case in which resonators 410 are arranged in a circular shape and respective lengths of the resonators 410 are different from each other.

In this way, resonators included in the band separation unit 100 may be arranged in various ways. In FIG. 4, it is depicted that the resonators 410 are arranged in a circular shape. However, the resonators 410 may be arranged such that a central region of an arrangement forms a polygonal shape.

Figure 5:
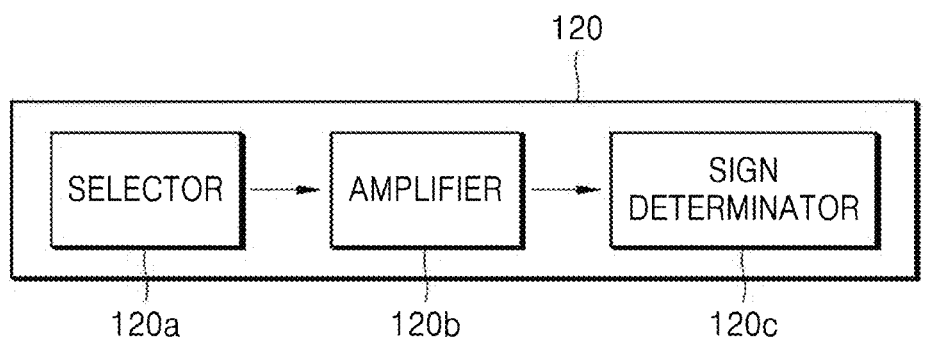
FIG. 5 is a block diagram of an example of a configuration of an individual channel sound signal processing block (circuit) of FIG. 1.

Each of individual channel sound signal processing blocks 120, 122, 124, 126, and 128 may include signal processing circuits, each of which may be implemented, for example, by a microprocessor. FIG. 5 shows a circuit configuration of the first individual channel sound signal processing block 120 as an example of the above case. The circuit configuration may be applied to the all individual channel sound signal processing blocks 120, 122, 124, 126, and 128 included in the signal processor 130.

Referring to FIG. 5, the first individual channel sound signal processing block 120 may include a first selector 120a, an amplifier 120b, and a sign determiner 120c. The first individual channel sound signal processing block 120 may further include other elements.

As described above, the first selector 120a determines whether or not an inputted sound signal will be selected as a sound signal to be processed by comparing an intensity of the inputted sound signal with a threshold intensity level set in advance. When the inputted sound signal is selected as a sound signal to be processed as a result of such a comparison, the inputted sound signal is transmitted to the amplifier 120b. The amplifier 120b amplifies the sound signal provided from the first selector 120a to meet a gain condition that is set in advance. The sound signal amplified by the amplifier 120b is transmitted to the sign determiner 120c. The sign determiner 120c determines a sign of the sound signal received from the amplifier 120b. The sound signal outputted from the sign determiner 120c is transmitted to the adder 150.

Figure 6:
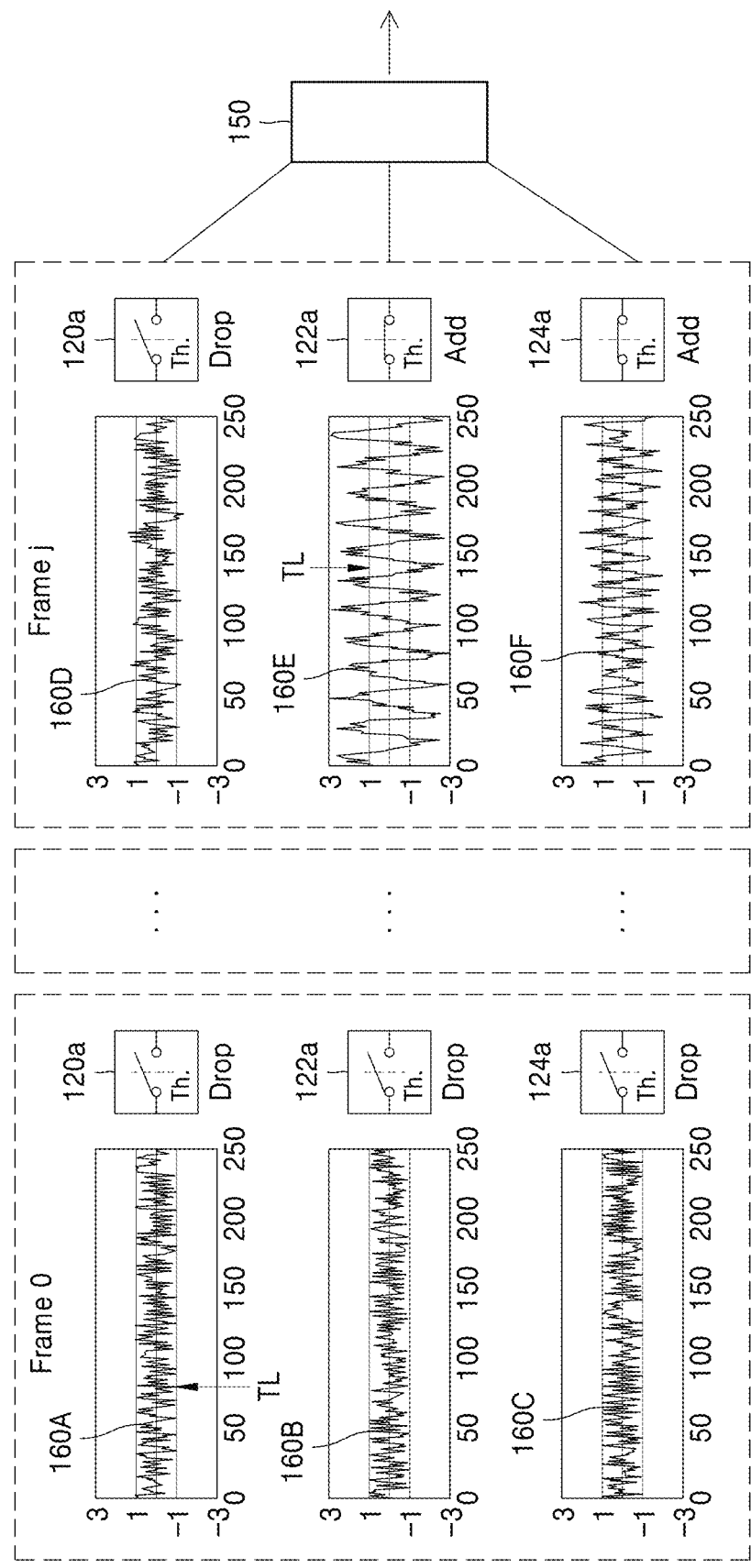
FIG. 6 is a sound signal-time graph showing a sound signal selective operation of an individual channel sound signal processing block.

FIG. 6 shows a process of selecting a sound signal in three selected individual channel sound signal processing blocks, for example, the first, second, and third individual channel sound signal processing blocks 120, 122, and 124 of the individual channel sound signal processing blocks 120, 122, 124, 126, and 128 included in the signal processor 130. For convenience, only the first, second, and third selectors 120a, 122a, and 124a of configurations of each of the first, second, and third individual channel sound signal processing blocks 120, 122, and 124 are depicted.

In FIG. 6, reference numerals 160A. 160B, 160C, 160D, 160E, and 160F indicate sound signal frames inputted to the first, second, and third selectors 120a, 122a, and 124a. "Frame 0" indicates a sound signal frame measured in a first time section. "Frame j" indicates a sound signal frame measured in a jth time section. The first, second, and third sound signal frames 160A, 160B, and 160C are frames measured in the same time section (the first time section), and the fourth, fifth, and sixth sound signal frames 160D, 160E, and 160F are frames measured in the same time section (the jth time section).

The first and fourth sound signal frames 160A and 160D are in the same frequency band, and are inputted to the first selector 120a through the same channel (resonator) (for example, the first resonator 110). The second and fifth sound signal frames 160B and 160E are in the same frequency band, and are inputted to the selector 122a through the same channel (for example, the second resonator 112). The third and sixth sound signal frames 160C and 160F are in the same frequency band, and are inputted to the third selector 124a through the same channel (for example, the third resonator 114). The frequency band of the first and fourth sound signal frames 160A and 160D, the frequency band of the second and fifth sound signal frames 160B and 160E, and the frequency band of the third and sixth sound signal frames 160C and 160F are different from each other.

In FIG. 6, "Drop" indicates a case in which the selectors 122a do not select the inputted sound signal as a sound signal to be processed, and "Add" indicates a case in which the selectors 122a select the inputted sound signal as a sound signal to be processed.

Referring to FIG. 6, as in the case of each of the first, second, third, and fourth sound signal frames 160A, 160B, 160C, and 160D, when the intensity of a sound signal is less than a threshold intensity level TL or even though the intensity of a sound signal exceeds the threshold intensity level TL, when the exceeding degree is less than a set value, the corresponding sound signal may not be selected (Drop).

However, as in the case of each of the fifth and sixth sound signal frames 160E and 160F, when the intensity of the sound signal exceeds the threshold intensity level TL and the exceeding degree is greater than the set value, the corresponding sound signal is selected as "Add".

Process results of the first, second, and third selectors 120a, 122a, and 124a are transmitted to the adder 150 through respectively corresponding individual channel sound signal processing blocks and the sign determiner.

Figure 7:
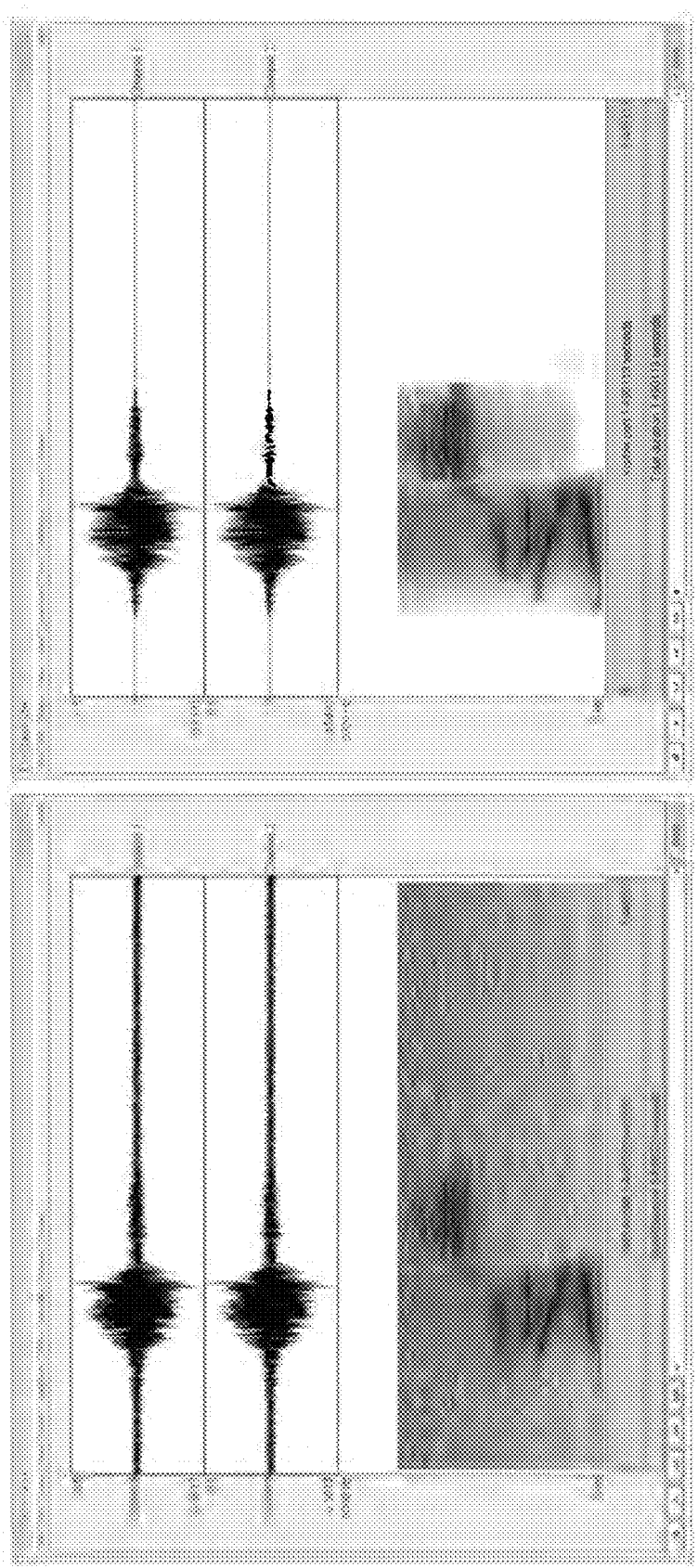
FIG. 7 is a pair of photographs showing test results in a first case when a sound signal processing apparatus according to an exemplary embodiment is applied and a second case when the sound signal processing apparatus according to an exemplary embodiment is not applied.

FIG. 7 illustrates a pair of photographs showing test results in the case when a sound signal processing apparatus according to an exemplary embodiment is applied and a case when the sound signal processing apparatus according to an exemplary embodiment is not applied.

In FIG. 7, an image on left side shows a result when the sound signal processing apparatus according to an exemplary embodiment is not applied, and an image on the right side shows a result when the sound signal processing apparatus according to the exemplary embodiment is applied.

Referring to the image on left side in FIG. 7, a sound signal appears in all of sound signal frames in each channel, regardless of the intensity of the sound signal.

However, referring to the image on right side in FIG. 7, it is seen that a sound signal appears in a portion where the sound signal is relatively large, and the sound signal does not appear in the region where the sound signal is small (noise signal).

This result indicates that when the sound signal processing apparatus according to an exemplary embodiment is applied, noise may be reduced and the clarity of a sound signal may be increased.

Figure 8:
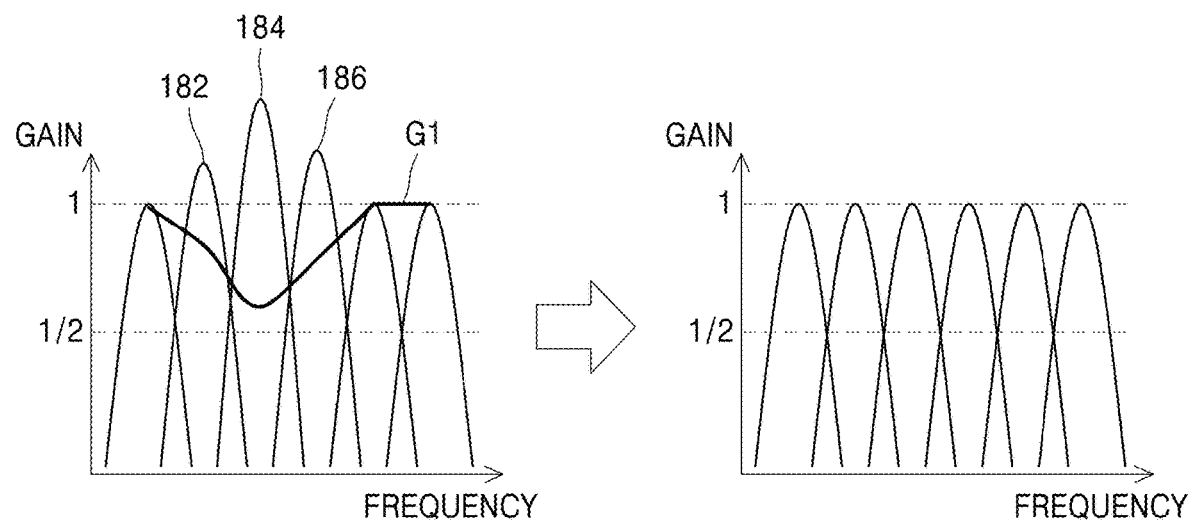
Figure 9:
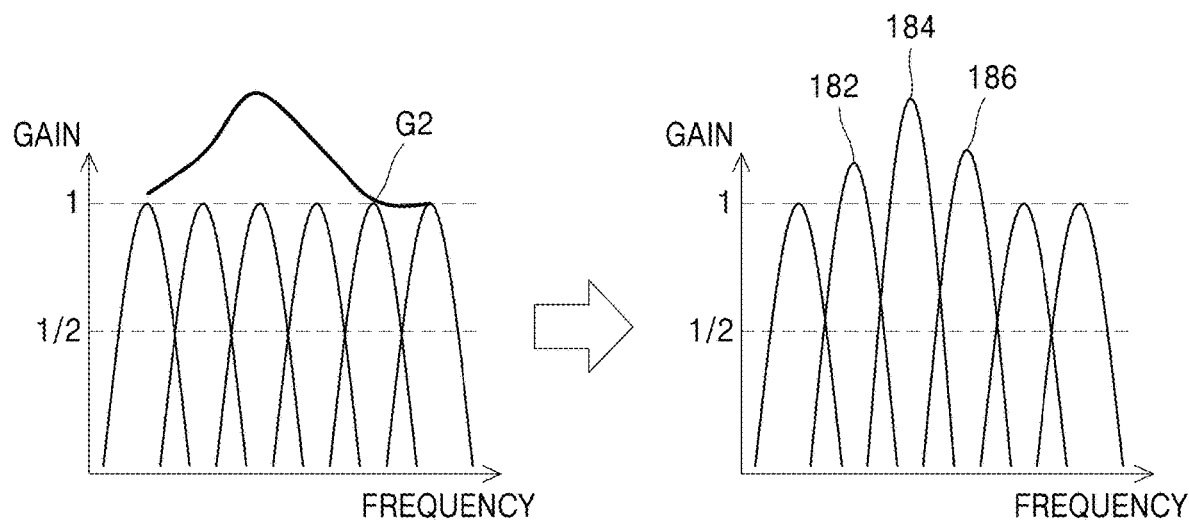

FIGS. 8, 9, and 10 are gain-frequency graphs showing methods of controlling an overall gain profile in a sound signal processing apparatus, according to an exemplary embodiment. In FIGS. 8, 9, and 10, a horizontal axis indicates frequency and a vertical axis indicates gain.

FIG. 8 shows a case in which an overall gain profile of a sound signal processing apparatus is controlled to be flat by individually controlling a gain of each channel.

In FIG. 8, as depicted on the left graph, in an overall gain profile of a sound signal processing apparatus before performing gain control, when the overall gain profile is not flat because gains 182, 184, and 186 of second, third, and fourth channels are relatively high and greater than or equal to one (1), a line of the overall gain profile may be set to be a first graph G1. In FIG. 8, as depicted on the right graph, the overall gain profile of the sound signal processing apparatus is controlled to be flat by controlling amplifying operations of amplifiers of the individual channel sound signal processing blocks that respectively correspond to the second, third, and fourth channels to be suitable for the above set.

FIG. 9 shows a case that is opposite to the case of FIG. 8.

As depicted on the left graph of FIG. 9, when an overall gain profile of a sound signal processing apparatus is flat, the gains 182, 184, and 186 of the second, third, and fourth channels are increased to one (1) or more as depicted on the right graph of FIG. 9 by setting the overall gain profile of the sound signal processing apparatus to be a second graph G2 on the left graph. When an amplifying operation of the amplifiers of the individual channel sound signal processing blocks that respectively correspond to the second, third, and fourth channels is controlled according to the set value based on the second graph G2, as depicted on the right graph of FIG. 9, in the overall gain profile of the sound signal processing apparatus, a gain that corresponds to the second, third, and fourth channels is greater than 1.

FIG. 10 shows a case of controlling an overall gain profile of a sound signal processing apparatus by maintaining an amplifying operation of the amplifiers of each of the individual channel sound signal processing blocks constant, that is, maintaining gain rates of all channels constant, and by controlling an arrangement density of resonators based on frequency bands in an arrangement of the first through fifth resonators 110, 112, 114, 116, and 118 included in the band separator 100.

The controlling of an arrangement density of resonators based on frequency bands denotes that the number of resonators in each of the frequency bands (sound bands) is different from each other. For example, a further larger number of resonators may be arranged in a high frequency sound band than in a low frequency sound band.

Further, the controlling of arrangement density based on frequency bands may denote that even if the number of resonators in each frequency band is uniform, a resonance frequency difference between the resonators arranged in a specific band, for example, a low frequency sound band, may be less than a resonance frequency difference between the resonators arranged in other frequency bands.

For example, when the resonators are uniformly arranged across all sound bands, a resonance frequency difference between the resonators arranged in a low frequency sound band may be maintained as 5 Hz, and a resonance frequency difference between the resonators arranged in a high frequency sound band a medium sound band may be maintained as 10 Hz.

The left-side drawing in FIG. 10 shows gains of channels when the resonators are uniformly arranged with respect to the whole frequency band (whole sound band). In this case, an overall gain profile 190 of the sound signal processing apparatus is flat.

When a resonator arrangement density in a selected band is different from a remaining band, as depicted on the right graph in FIG. 10, gain profiles of channels are concentrated in a high band HB where the resonator arrangement density is high, and thus, a gain profile overlap in the high band is greater than a gain profile overlap in the remaining band. As a result, in an overall gain profile 200 of the sound signal processing apparatus, the overall gain profile 200 has a shape in which the gain in the high band HB is relatively higher than that of the remaining band.

The sound signal processing apparatus according to an exemplary embodiment uses a plurality of resonators as devices that separate inputted sound signals or acoustic signals based on frequency bands. The resonators respectively may be channels and sound signal filters. An individual channel sound signal processing block (a circuit) is connected to each of the resonators. The individual channel sound signal processing block determines whether an inputted sound signal will be included in a final output sound signal or not, and a provided process is performed with respect to the inputted sound signal that is determined to be included in the final output sound signal, and afterwards, is included in the final output sound signal.

In this process, a sound signal regarded as noise in each band is removed. Therefore, a signal-to-noise (S/N) ratio of a final sound signal outputted by adding sound signals of each of the channels may be increased. In this aspect, the inclusion of a noise sound in a final outputted sound signal may be reduced, and accordingly, the clarity of a sound signal may be increased.

Further, since the signal processing in each channel is independently performed and a signal gain may be controlled in this process, a gain control in each band of an inputted sound signal is possible, and accordingly, a gain of a desired band may be relatively increased or reduced.

With this function, the sound signal processing apparatus described above may be used for various fields. For example, the sound signal processing apparatus described above may be realized as a chip solution type acoustic sensor and may remove noise in mobile devices, home appliances, and/or vehicles. The sound signal processing apparatus described above also may perform an acoustic event recognition.

While one or more embodiments have been described with reference to the drawings, it will be understood by persons having ordinary skill in the art that various changes in form and details may be made therein without departing from the spirit and scope as defined by the following claims.

What is claimed is:

1. A sound signal processing apparatus comprising:
a band separator comprising a plurality of resonators, the plurality of resonators being configured to separate an inputted sound signal into a plurality of sound signals based on frequency bands;
a signal processor comprising a plurality of individual channel sound signal processors that have one-to-one correspondence with the plurality of resonators and have a threshold intensity level that is individually set for each of the plurality of individual channel sound signal processors, each of the plurality of individual channel sound signal processors comprising a selector configured to
receive a sound signal of the plurality of sound signals from a corresponding resonator of the plurality of resonators,
select the sound signal that is received from the corresponding resonator in response to an intensity of the sound signal received from the corresponding resonator being greater the threshold intensity level, and
block the sound signal that is received from the corresponding resonator in response to the intensity of the sound signal received from the corresponding resonator being less than or equal to the threshold intensity level; and
an adder configured to add the selected sound signal that is received from at least one of the plurality of individual channel sound signal processors.

2. The sound signal processing apparatus of claim 1, wherein the plurality of resonators correspond to a plurality of mechanical resonators.

3. The sound signal processing apparatus of claim 1, wherein an arrangement density of the plurality of resonators is uniform with respect to a combination of the frequency bands.

4. The sound signal processing apparatus of claim 1, wherein an arrangement density of the plurality of resonators varies based on the frequency bands.

5. The sound signal processing apparatus of claim 1, wherein the plurality of resonators are arranged in a row, and wherein each of the plurality of resonators has a different length.

6. The sound signal processing apparatus of claim 1, wherein the plurality of resonators are arranged in a circular shape, and wherein each of the plurality of resonators has a different length.

7. The sound signal processing apparatus of claim 1, wherein each of the plurality of individual channel sound signal processors comprises:
- an amplifier configured to amplify the selected sound signal received from the selector to output an amplified signal; and
- a sign determiner configured to determine a sign of the amplified signal.

8. A method of operating a sound signal processing apparatus, the method comprising:
- separating an inputted sound signal, by a plurality of resonators, into a plurality of sound signals based on frequency bands;
- receiving the plurality of sound signals from the plurality of resonators, by a plurality of individual channel sound signal processors that have one-to-one correspondence with the plurality of resonators and have a threshold intensity level that is individually set for each of the plurality of individual channel sound signal processors;
- selecting, by the plurality of individual channel sound signal processors, at least one sound signal, from among the plurality of sound signals received from the plurality of resonators, in response to an intensity of the at least one sound signal being greater the threshold intensity level;
- blocking, by the plurality of individual channel sound signal processors, the plurality of sound signals other than the selected at least one sound signal; and
- adding the selected at least one sound signal that is received from the plurality of individual channel sound signal processors.

9. The method of claim 8, wherein the plurality of resonators correspond to a plurality of mechanical resonators, and the inputted sound signal is separated into the plurality of sound signals by using the plurality of mechanical resonators.

10. The method of claim 8, further comprising controlling an overall gain profile of the sound signal processing apparatus.

11. The method of claim 10, wherein the controlling the overall gain profile of the sound signal processing apparatus comprises one from among changing the overall gain profile from a flat gain profile to a non-flat gain profile and changing the overall gain profile from the non-flat gain profile to the flat gain profile.

12. The method of claim 8, further comprising determining whether or not each of the plurality of sound signals is a sound signal to be processed.

13. The method of claim 12, further comprising amplifying the plurality of sound signals to be processed when the plurality of sound signals to be processed are determined.

14. The method of claim 13, further comprising determining a sign of each of the amplified plurality of sound signals and outputting the amplified plurality of sound signals.

15. The method of claim 13, wherein the amplifying the plurality of sound signals to be processed comprises differentiating a first amplifying rate of a first portion of an entirety of the plurality of sound signals determined as sound signals to be processed from a second amplifying rate of a second portion of the entirety of the sound signals that includes all remaining sound signals that are not included in the first portion.

16. The method of claim 8, wherein an arrangement density of the plurality of resonators is uniform with respect to a combination of the frequency bands.

17. The method of claim 8, wherein an arrangement density of the plurality of resonators varies based on the frequency bands.

18. An acoustic sensor comprising a sound signal processing apparatus, wherein the sound signal processing apparatus comprising:
- a band separator comprising a plurality of mechanical resonators that have different lengths and different frequency bands from each other, the plurality of mechanical resonators being configured to separate an inputted sound signal into a plurality of sound signals based on the different frequency bands;
- a signal processor comprising a plurality of individual channel sound signal processors that have one-to-one correspondence with the plurality of mechanical resonators and have a threshold intensity level that is individually set for each of the plurality of individual channel sound signal processors, each of the plurality of individual channel sound signal processors comprising a selector configured to
- receive a sound signal of the plurality of sound signals from a corresponding mechanical resonator of the plurality of mechanical resonators,
- select the sound signal that is received from the corresponding mechanical resonator in response to an intensity of the sound signal received from the corresponding mechanical resonator being greater the threshold intensity level, and
- block the sound signal that is received from the corresponding mechanical resonator in response to the intensity of the sound signal received from the corresponding mechanical resonator being less than or equal to the threshold intensity level; and
- an adder configured to add the selected sound signal that is received from at least one of the plurality of individual channel sound signal processors.

19. A mobile device comprising a sound signal processing apparatus, wherein the sound signal processing apparatus comprising:
- a band separator comprising a plurality of mechanical resonators that have different lengths and different frequency bands from each other, the plurality of mechanical resonators being configured to separate an inputted sound signal into a plurality of sound signals based on the different frequency bands;
- a signal processor comprising a plurality of individual channel sound signal processors that have one-to-one correspondence with the plurality of mechanical resonators and have a threshold intensity level that is individually set for each of the plurality of individual channel sound signal processors, each of the plurality of individual channel sound signal processors comprising a selector configured to
- receive a sound signal of the plurality of sound signals from a corresponding mechanical resonator of the plurality of mechanical resonators,
- select the sound signal that is received from the corresponding mechanical resonator in response to an intensity of the sound signal received from the corresponding mechanical resonator being greater the threshold intensity level, and
- block the sound signal that is received from the corresponding mechanical resonator in response to the intensity of the sound signal received from the corresponding mechanical resonator being less than or equal to the threshold intensity level; and an adder configured to add the selected sound signal that is received from at least one of the plurality of individual channel sound signal processors.

20. A home appliance comprising a sound signal processing apparatus, wherein the sound signal processing apparatus comprising:
a band separator comprising a plurality of mechanical resonators that have different lengths and different frequency bands from each other, the plurality of mechanical resonators being configured to separate an inputted sound signal into a plurality of sound signals based on the different frequency bands;
a signal processor comprising a plurality of individual channel sound signal processors that have one-to-one correspondence with the plurality of mechanical resonators and have a threshold intensity level that is individually set for each of the plurality of individual channel sound signal processors, each of the plurality of individual channel sound signal processors comprising a selector configured to
receive a sound signal of the plurality of sound signals from a corresponding mechanical resonator of the plurality of mechanical resonators,
select the sound signal that is received from the corresponding mechanical resonator in response to an intensity of the sound signal received from the corresponding mechanical resonator being greater the threshold intensity level, and
block the sound signal that is received from the corresponding mechanical resonator in response to the intensity of the sound signal received from the corresponding mechanical resonator being less than or equal to the threshold intensity level; and
an adder configured to add the selected sound signal that is received from at least one of the plurality of individual channel sound signal processors.

21. A vehicle comprising a sound signal processing apparatus, wherein the sound signal processing apparatus comprising:
a band separator comprising a plurality of mechanical resonators that have different lengths and different frequency bands from each other, the plurality of mechanical resonators being configured to separate an inputted sound signal into a plurality of sound signals based on the different frequency bands;
a signal processor comprising a plurality of individual channel sound signal processors that have one-to-one correspondence with the plurality of mechanical resonators and have a threshold intensity level that is individually set for each of the plurality of individual channel sound signal processors, each of the plurality of individual channel sound signal processors comprising a selector configured to
receive a sound signal of the plurality of sound signals from a corresponding mechanical resonator of the plurality of mechanical resonators,
select the sound signal that is received from the corresponding mechanical resonator in response to an intensity of the sound signal received from the corresponding mechanical resonator being greater the threshold intensity level, and
block the sound signal that is received from the corresponding mechanical resonator in response to the intensity of the sound signal received from the corresponding mechanical resonator being less than or equal to the threshold intensity level; and
an adder configured to add the selected sound signal that is received from at least one of the plurality of individual channel sound signal processors.

* * * * *